Oct. 29, 1968 C. J. BUTE ETAL 3,408,612

CONNECTOR DESIGN

Filed Sept. 26, 1966

INVENTORS
CURTIS J. BUTE
GORDON E. LA VALLEY

BY Thomas J. Nikolai
ATTORNEY

United States Patent Office 3,408,612
Patented Oct. 29, 1968

3,408,612

CONNECTOR DESIGN

Curtis J. Bute, St. Paul, and Gordon E. La Valley, White Bear Lake, Minn., assignors to Sperry Rand Corporation, New York, N.Y., a corporation of Delaware Filed Sept. 26, 1966, Ser. No. 582,143
11 Claims. (Cl. 339—17)

ABSTRACT OF THE DISCLOSURE

An apparatus for the mounting of an encapsulated microelectronic circuit that requires no permanent affixing thereto. The apparatus includes an electrically insulative body having an aperture therein that substantially conforms to the planar contour of the circuit for locating the circuit in a fixed relationship therewith. Spaced-apart raised portions on the body conform to the spaced-apart pattern of the circuit's electrical leads for insulatively aligning the circuit's electrical leads along the body's two opposing surfaces. A channel along a bottom surface of the body receives the end terminals of the circuit's electrical leads which are secured therein by a press-fit electrical insulating plug. A second embodiment provides an electrically insulative, heat conductive body of two sections having mating surfaces having a cavity therebetween for holding the circuit in a fixed relationship. The circuit's electrical leads are formed about the two body sections for securing the two body sections about the circuit in the fixed relationship.

Figure 1:
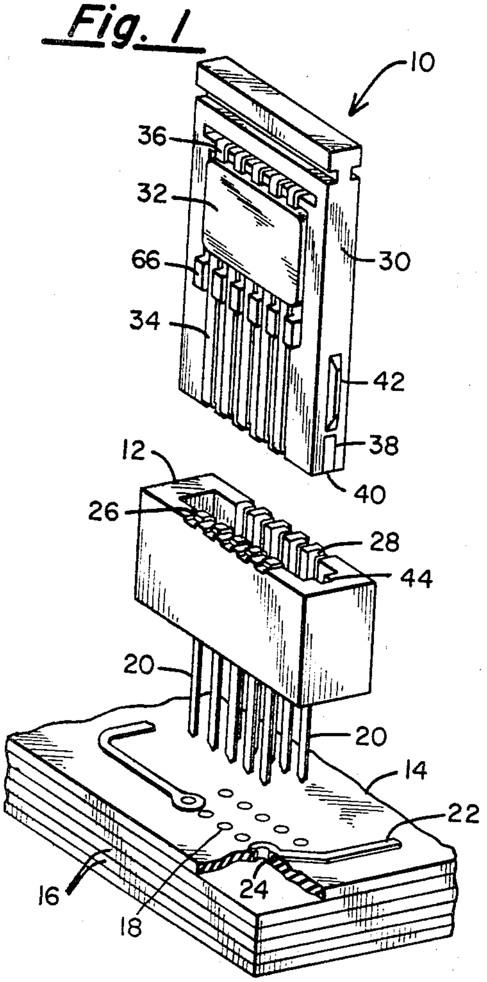

With the advent of the mass production of digital computers, it has become increasingly desirable to utilize large numbers of similar circuits packaged in individual plug-in modules or "card-types." Such circuits have, in the past, been mounted on printed circuit boards with all components affixed thereto in a substantially permanent manner with the entire assembly coupled into the system by mounting in plug-in type rack mounts. With the need for more highly compact packaging techniques, a still further improvement in high density packaging has resulted in a new field of "microelectronics" which may be defined as that entire body of electronic art that is connected with or applied to the realization of electronic systems from extremely small electronic parts. One technique utilized in this still larger generic field is devoted to a "semiconductor integrated circuit" which may be defined as a functional electronic block wherein both active and passive component parts are produced integrally with, and inseparable from, an active substate. As regions in each block may be caused to behave as conventional circuit elements many diffused resistors and transistors may be fabricated in the same block to provide resistor-transistor coupled logic (RTCL) circuits.

The preferred embodiment of the present invention is directed toward the packaging of an encapsulated circuit, such as an integrated circuit flat-pack, in a supporting connector that requires no soldering or otherwise permanent affixing of the integrated circuit's electrical leads to the connector-holder thereof. As the cost of such integrated circuit has, due to mass production techniques, been greatly reduced the cost of the means for coupling the integrated circuit to the using system has assumed a substantial portion of the cost of such system. Accordingly, it is highly desirable to provide a packaging technique whereby the integrated circuit may be a throw-away item as an easily replaceable module of the overall system. In the preferred embodiment of the present invention there is provided a multi-layer printed circuit chassis upon which there is affixed a mating receptacle for the integrated circuit connector which connector uses the integrated circuit electrical leads as the electrical contacting members, which members are compressively in contact with the receptacle's mating electrical contacts. The resulting package provides a highly reliable means of interconnecting the integrated circuit with the system of which it is associated while permitting rapid replacement thereof, and it is considered to be an improvement over that system provided by the copending patent application of O. C. Joachim, Ser. No. 504,034, filed Oct. 23, 1965, now Patent No. 3,341,806, which application is assigned to the Sperry Rand Corporation, as is the present application.

Accordingly, it is a primary object of the present invention to provide a novel method of packaging an encapsulated circuit in a pluggable connector that requires no soldering or otherwise permanent affixing of the encapsulated circuit's electrical leads to the holder thereof.

It is a further object of the present invention to provide a novel packaging technique whereby the encausulated circuit may be a throw-away item as an easily replacement module of an overall system.

With particular reference to FIG. 1 there is presented an exploded view of the preferred embodiment of the present invention in which there are illustrated a connector 10, its mating receptacle 12, and a chassis 14, which chassis comprises a plurality of printed circuit boards 16. Chassis 14 is illustrated as having a plurality of apertures 18 therethrough having a predetermined pattern matching that of the pattern of terminals 20 of receptacle 12. Electrical interconnection between a selected terminal 20 and a predetermined printed circuit connector 22 on a selected printed circuit board 16 may be achieved by providing an electrical contacting means therebetween, such as an eyelet or a plated-through hole 24 in a selected printed circuit board 16. Receptacle 12 may be affixed to chassis 14 by any of many well known means such as soldering to the individual plated-through holes 24, soldering at the bottom of chassis 14, or by utilizing the press-fit resistance of the terminals 20 in chassis 14.

Connector 10 is comprised of a main body portion 30 of an electrically nonconducting or insulative material having first and second rectangular-shaped opposing parallel surfaces in which there is established an integrated circuit locating means, such as an aperture therethrough, or cavity in, body 30, for the locating of an integrated circuit flat-pack 32 in a relatively fixed relationship therewith. Integrated circuit 32 has groups of a plurality of eletcrical leads 34 from a first end and leads 36 from a second end thereof, which individual electrical leads form electrical interconnections between corresponding compressive contact members 26 and 28 of receptacle 12. Body 30 has a channel-like electrical lead retaining means 38 running across the bottom surface of body 30 into which the end terminals of electrical leads 34 and 36 are inserted and retained in place by retaining plug 40. Body 30 has, additionally, a plurality of electrical lead aligning means, such as raised portions 66 for maintaining electrical leads 34 and 36 in a predetermined, placed-apart pattern along its first and second surfaces. These electrical lead aligning means maintain electrical leads 34 and 36 in a spaced-apart insulative relationship, which in the bottom portion of connector 10 that is inserted into receptacle 12 causes electrical leads 34 and 36 to mate with the pattern of compressive contact members 26 and 28 of receptacle 12. Additionally, for purposes of polarizing connector 10 and receptacle 12 there is provided a raised polarizing means 42 that mates with polarizing slot 44 of receptacle 12, which polarizing means 42 and slot 44 preclude the reversible insertion of connector 10 in receptacle 12.

Figure 2:
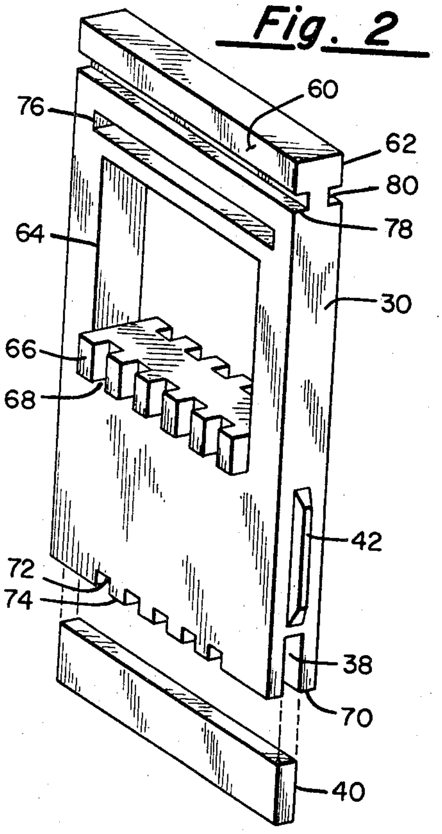

With particular reference to FIG. 2 there is illustrated an isometric view of body 30 of connector 10 providing a more detailed view of the particular construction thereof. Body 30 is of electrically nonconductive, i.e., insulative, material having first and second rectangular-shaped, parallel, opposing surfaces 60 and 62. Body 30 has an integrated circuit locating means aperture 64 having planar dimensions substantially conforming to the to-be-utilized integrated circuit 32—see FIG. 1—for establishing it in a substantially fixed relationship therewith. On both surfaces 60 and 62 there are provided a plurality of raised portions 66 forming a plurality of slot-like channels 68 therebetween that function as a means for aligning the electrical leads 34 and 36—see FIG. 1—of integrated circuit 32 in a predetermined spaced-apart pattern along surfaces 60 and 62, respectively. Additionally, there are provided along bottom surface 70 a pluarlity of slot-like channels 72 separated by raised portions 74 which channels 72 are aligned with the like plurality of channels 68 for maintaining the associated group of electrical leads of integrated circuit 32 in a spaced-apart pattern along said surfaces 60, 62 and along bottom surface 70.

Slot 38, which is along the bottom surface 70, performs the function of retaining the end terminal portions of the associated electrical leads 34 and 36 when plug means 40 is inserted therein compressing such electrical lead end-terminals between it and the side walls of slot 38. As discussed with respect to FIG. 1 polarizing means 42 is a raised channel-like member on one side surface of body 30 which ensures the proper orientation of body 30 in its mating receptacle 12. Slot-like aperture 76 is provided in body 30 and is of such dimensions to permit the passage therethrough of leads 36 of the particular integrated circuit 32 utilized whereby leads 36 may pass down the surface 62, through channels 68, and on into channel-like slots 72 on bottom surface 70 and thence into slot 38. Channels 78 and 80, which are of a slot-like cross-section, run across surfaces 60 and 62 and are provided for the sole function of permitting a sure fingertip-grip of body 30 for the easy removal thereof from receptacle 12.

Figure 3:
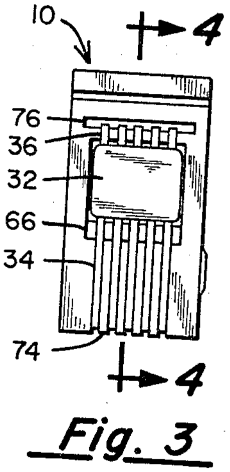
Figure 4:
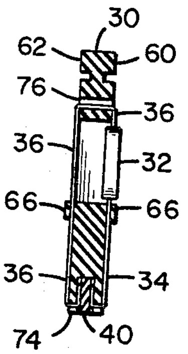

With particular reference to FIG. 3 there is illustrated a plan view of connector 12 in which there is installed an integrated circuit 32 such as Signetics type SE201G type integrated circuit of a flatpack design in a glass-Kovar package of approximately one-quarter inch wide by one-quarter inch long by one sixteenth inch thick having a plurality of leads 34 and 36 of a width of approximately 0.015 inch in a predetermined spaced-apart pattern on centers of approximately 0.050 inch. Integrated circuit 32 is, as stated above, assembled in body 30 by the orientation of its leads 34 and 36 in the associated electrical lead aligning channels 68 and 72 with the end terminals of electrical leads 34 and 36 retained in channel 38 along its side walls by the press-fit insertion of plug 40. FIG. 4 is a cross-section of connector 10 taken along line 4—4 of FIG. 3 and is presented to better understand the relationship of body 30, circuit 32, and plug 40.

Integrated circuit 32 may be installed in body 30 in the following manner. Initially, the first group of electrical leads 36 emanating from the top edge of integrated circuit 32 are inserted through aperture 76. Next, the encapsulated portion of integrated circuit 32 is pressed into the circuit locating means of aperture 64 with the second group of electrical leads 34 aligned in the corresponding channels 68 of surface 60. The end terminals of electrical leads 34 are then aligned with and pressed into channels 72 on the bottom surface 70. Next, the first group of electrical leads 36 are gently bent downward along surface 62 and into their corresponding channels 68 between raised portions 66 of surface 62. The end terminals of electrical leads 36 are then aligned with and depressed into the corresponding channels 72 on bottom surface 70 as with the end terminals of electrical leads 34. Next, the end terminals of electrical leads 34 and 36 are fixedly retained in channel 38 by the press-fit insertion of plug 40. It has been determined by applicants, due to the angles, apertures and channels through which electrical leads 34 and 36 are bent and then retained by plug 40 in channel 38, that integrated circuit 32 is secured in a manner so as to be substantially immune to the most rigid shock and vibration environments. Additionally, by using the as-supplied electrical leads of the integrated circuit package applicants' connector 10 obviates the necessity for soldering or for additional terminations required by most prior art packaging techniques. Further, by inserting a substantial portion of connector 10 in receptacle 12 there is provided an arrangement that is substantially more immune to vibration and shock environments than that of the above referenced O. C. Joachim application.

Figures 5, 6:
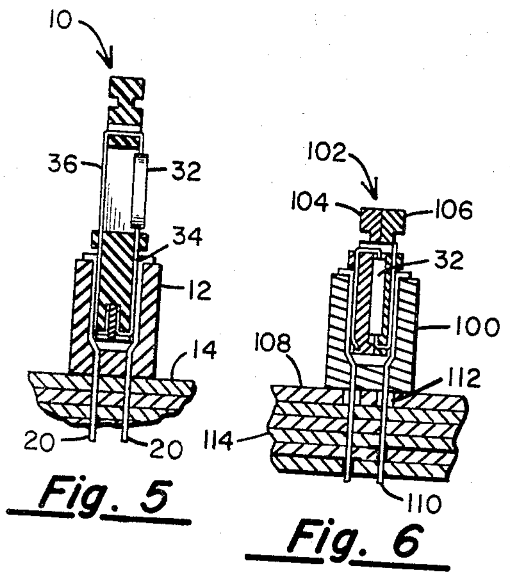

With particular reference to FIG. 5 there is presented a cross-section of the assembly of the components of FIG. 1 wherein there is illustrated the assembled relationship of connector 10, receptacle 12 and chassis 14.

With particular reference to FIG. 6 there is presented a cross-section of an assembly, similar to that of FIG. 5, in which the receptacle 100 and connector 102, composed of first and second sections 104 and 106, are of a heat conductive but electrically insulative material whereby heat generated by circuit 32 is readily conducted away into a cold plate 108. In this arrangement circuit 32 is substantially within the cavity formed by the side walls of receptacle 100 thereby providing the shortest heat conductive path to sections 104 and 106, receptacle 100 and cold plate 108. Sections 104 and 106 are designed to have mating surfaces having a cavity therebetween for holding circuit 32 in a fixed relationship, as with aperture 64 of body 30, while providing electrical lead aligning means similar to channels 68, 72 and 76 of body 30 of FIG. 2. This embodiment of FIG. 6 utilizes no electrical lead retaining means similar to plug 40 of FIG. 2, but relies on the compressive properties of the mating electrical contact members of receptacle 100 for securing the electrical leads of circuit 32 when connector 102 is properly inserted in receptacle 100. Receptacle 100 has its leads 110 passing through suitable apertures 112 in cold plate 108 and mating with the conductive strips of chassis 114 in a manner similar to that of FIG. 1.

It is apparent, therefore, that applicants have presented a novel electrical connector for providing a pluggable interconnection between an encapsulated electrical circuit and an electrical chassis member. It is understood that suitable modifications may be made in the structure as disclosed provided such modifications come within the spirit and scope of the appended claims. Having, now therefore, fully illustrated and described our invention what we claim to be new and desire to protect by Letters Patent is set forth in the appended claims.

What is claimed is:

1. An electrical apparatus for the mounting of an encapsulated electrical circuit, which circuit has a plurality of electrical leads emanating therefrom in a predetermined, spaced-apart pattern, comprising:

a body of electrically insulative material having first and second parallel, spaced-apart surfaces, and further including:

circuit locating means substantially conforming to the planar contour of said circuit for locating said circuit in a fixed relationship therewith;

electrical lead aligning means arranged in said predetermined spaced-apart pattern and projecting from said first and second surfaces for aligning said electrical leads in said predetermined, spaced-apart pattern along said first and second surfaces; and electrical lead retaining means lying substantially transverse said aligning means comprising a continuous channel in a bottom surface of said body which bottom surface is substantially perpendicular to and bounded by said first and second surfaces for receiving the end terminals of said electrical leads.

2. The apparatus of claim 1 wherein said electrical lead aligning means includes a plurality of raised areas on said first and second surfaces and a plurality of depressed areas on said bottom surface for forming insulative alignment of said electrical leads into said channel.

3. The apparatus of claim 2 wherein said circuit locating means is a first aperture passing through said first and second surfaces of said body.

4. The apparatus of claim 3 wherein said body further includes a second aperture passing through said first and second surfaces of said body for permitting the passage of electrical leads therethrough.

5. In an electrical apparatus, the combination comprising:

an encapsulated electrical circuit having a plurality of electrical leads emanating therefrom in a predetermined, spaced-apart pattern;

a body of electrically insulative material having first and second rectangular-shaped opposing parallel surfaces, said body further including:

circuit locating means for locating said circuit in a fixed relationship therewith;

first and second electrical lead aligning means along said first and second surfaces, respectively, for maintaining first and second groups of said electrical leads in a predetermined, spaced-apart pattern along said first and second surfaces, respectively;

electrical lead retaining means lying substantially transverse said first and second aligning means comprising a continuous channel in a bottom surface of said body which bottom surface is substantially perpendicular to and bounded by said first and second surfaces for receiving the end terminals of said first and second groups of electrical leads;

electrical lead retaining plug means adapted to be received by said electrical lead retaining means for electrically insulatively securing the end terminals of said first and second groups of electrical leads in said electrical lead retaining means.

6. The apparatus of claim 5 wherein said body further includes a first aperture passing through said first and second surfaces of said body for permitting said second group of electrical leads to pass from said first surface through said second surface.

7. The apparatus of claim 6 wherein the end terminals of said first and second group of electrical leads are secured in a predetermined, spaced-apart pattern along first and second opposing sides, respectively, of said channel by said electrical lead retaining plug means.

8. The apparatus of claim 6 wherein said circuit locating means is a second aperture, passing through said first and second surfaces of said body, that substantially conforms to the planar outline of said circuit.

9. In an electrical apparatus, the combination comprising:

an encapsulated electrical circuit having a plurality of electrical leads emanating therefrom in a predetermined, spaced-apart pattern;

first and second electrically insulative, heat conductive body sections having mating surfaces, said mating surfaces having a cavity therebetween for holding said circuit in a fixed relationship;

said first and second body sections having first and second electrical lead aligning means along their nonmating surfaces for maintaining first and second groups of said electrical leads in a predetermined, spaced-apart pattern;

said first and second groups of electrical leads aligned in their associated first and second electrical lead aligning means for securing said first and second body sections about said circuit in said fixed relationship.

10. The apparatus of claim 9 further including an electrical receptacle having a body of electrically insulative, heat conductive material supporting first and second groups of compressive contact members having a spaced-apart pattern corresponding to and associated with said first and second groups of electrical leads, respectively, said circuit substantially within the cavity formed by the side walls of said receptacle for providing a short heat conductive path between said circuit and said receptacle.

11. The apparatus of claim 10 further including an electronic chassis having a cold plate, said receptacle mounted upon said cold plate for conducting the heat away from said circuit.

References Cited

UNITED STATES PATENTS

| | | | |
|---|---|---|---|
| 3,184,699 | 5/1965 | Spera | 324—158 |
| 3,238,455 | 3/1966 | Jankowski | 324—158 |
| 3,267,335 | 8/1966 | Walkow | 339—17 X |
| 3,297,974 | 1/1967 | Pittman | 339—17 |
| 3,354,394 | 11/1967 | James | 339—17 X |

MARVIN A. CHAMPION, *Primary Examiner.*

JOHN R. MOSES, *Assistant Examiner.*